(12) United States Patent
Alcouffe et al.

(10) Patent No.: US 9,588,157 B2
(45) Date of Patent: Mar. 7, 2017

(54) INTEGRATED CIRCUIT, CURRENT SENSE CIRCUIT FOR A PULSE WIDTH MODULATION DRIVER AND METHOD THEREFOR

(71) Applicants: Benoit Alcouffe, Tournefeuille (FR); Jerome Casters, Munich (DE); Tarek Hakam, Toulouse (FR); Bernard Pierre Francois Pechaud, Clermont le Fort (FR)

(72) Inventors: Benoit Alcouffe, Tournefeuille (FR); Jerome Casters, Munich (DE); Tarek Hakam, Toulouse (FR); Bernard Pierre Francois Pechaud, Clermont le Fort (FR)

(73) Assignee: NXP USA, Inc., Austin, TX (US)

( * ) Notice: Subject to any disclaimer, the term of this patent is extended or adjusted under 35 U.S.C. 154(b) by 288 days.

(21) Appl. No.: 14/554,151

(22) Filed: Nov. 26, 2014

(65) Prior Publication Data

US 2015/0377933 A1    Dec. 31, 2015

(30) Foreign Application Priority Data

Jun. 26, 2014    (WO) .................. PCT/IB2014/001400

(51) Int. Cl.
| G01R 1/20 | (2006.01) |
| G01R 19/257 | (2006.01) |
| G01R 19/00 | (2006.01) |
| B60T 8/176 | (2006.01) |
| H02M 3/158 | (2006.01) |
| H02M 1/00 | (2006.01) |

(52) U.S. Cl.
CPC ............ *G01R 19/257* (2013.01); *B60T 8/176* (2013.01); *G01R 19/0092* (2013.01); *H02M 3/1588* (2013.01); *H02M 2001/0009* (2013.01)

(58) Field of Classification Search
CPC .. G01R 1/203; G01R 15/146; G01R 19/0007; G01R 19/257; G01R 19/0092
See application file for complete search history.

(56) References Cited

U.S. PATENT DOCUMENTS

| 4,594,577 A | 6/1986 | Mao |
| 6,515,610 B1 * | 2/2003 | McCall ............... H03M 1/1225 341/141 |
| 9,419,627 B2 * | 8/2016 | Guthrie .................... H03L 5/00 |

(Continued)

*Primary Examiner* — Tung X Nguyen
(74) *Attorney, Agent, or Firm* — Charlene R. Jacobsen (57) ABSTRACT

A current sense circuit for a PWM driver comprises: a PWM control circuit comprising: a first switching device arranged to receive a PWM signal from the PWM driver whose current is to be sensed; and a second switching device whose supply current is arranged to track the sensed current of the PWM driver. An ADC is operably coupled to the first and second switching device. The ADC comprises: a DAC arranged to provide a current sense to the second switching device that tracks the current passing through the PWM driver; a first comparator arranged to receive and compare an output current from the DAC and an output current from the first switching device; and a first successive approximation register arranged to receive an output from the comparator and provide: a first output to the ADC; and a second output that provides a representation of the sensed current.

19 Claims, 7 Drawing Sheets

(56) References Cited

U.S. PATENT DOCUMENTS

2009/0299592 A1      12/2009  Oehler et al.
2010/0060257 A1*      3/2010  Azrai ................. G01R 19/0092
                                                            324/76.11
2010/0157635 A1       6/2010  Bagarelli et al.

* cited by examiner

INTEGRATED CIRCUIT, CURRENT SENSE CIRCUIT FOR A PULSE WIDTH MODULATION DRIVER AND METHOD THEREFOR

CROSS REFERENCE TO RELATED APPLICATION(S)

The present application claims priority to International Patent Application No. PCT/IB2014/001400, entitled "INTEGRATED CIRCUIT, CURRENT SENSE CIRCUIT FOR A PULSE WIDTH MODULATION DRIVER AND METHOD THEREFOR," filed on Jun. 26, 2014, the entirety of which is herein incorporated by reference.

FIELD OF THE INVENTION

The field of this invention relates to an integrated circuit and a current sense circuit for a pulse width modulation driver and method therefor.

BACKGROUND OF THE INVENTION

In traditional anti-lock braking systems (ABS) and electronic stabilisation programs (ESP), hydraulic control valve assemblies are used, sometimes referred to as an ABS hydraulic modulator unit. Hydraulic control valve assemblies typically contain valves, solenoids, and pistons to control the holding and release of the different hydraulic brake circuits under hard braking situations of vehicles. During normal operation the system lies dormant and the standard brake system is used. When a hard braking situation occurs, the system senses the rotational speed of the wheel speed sensors and makes decisions as to whether to hold or release pressure to a brake circuit. In traditional ABS and ESP, it is known that at least some of the valve coils may no longer be switched. Instead, analogised actuation is effected using pulse width modulated current control (PWM), which permits an almost analog actuation of the hydraulic valves.

Generally, a plurality of valve actuation circuits are provided, which are typically designed using metal oxide semiconductor (MOS) transistors connected in phase-opposition. These valve actuation circuits are usually implemented as integrated circuits, especially as some complex ABS systems require up to eight such valve actuation circuits to be present and complex ESP systems require up to twelve such valve actuation circuits to be present, in addition to numerous additional circuit parts.

Figure 1:
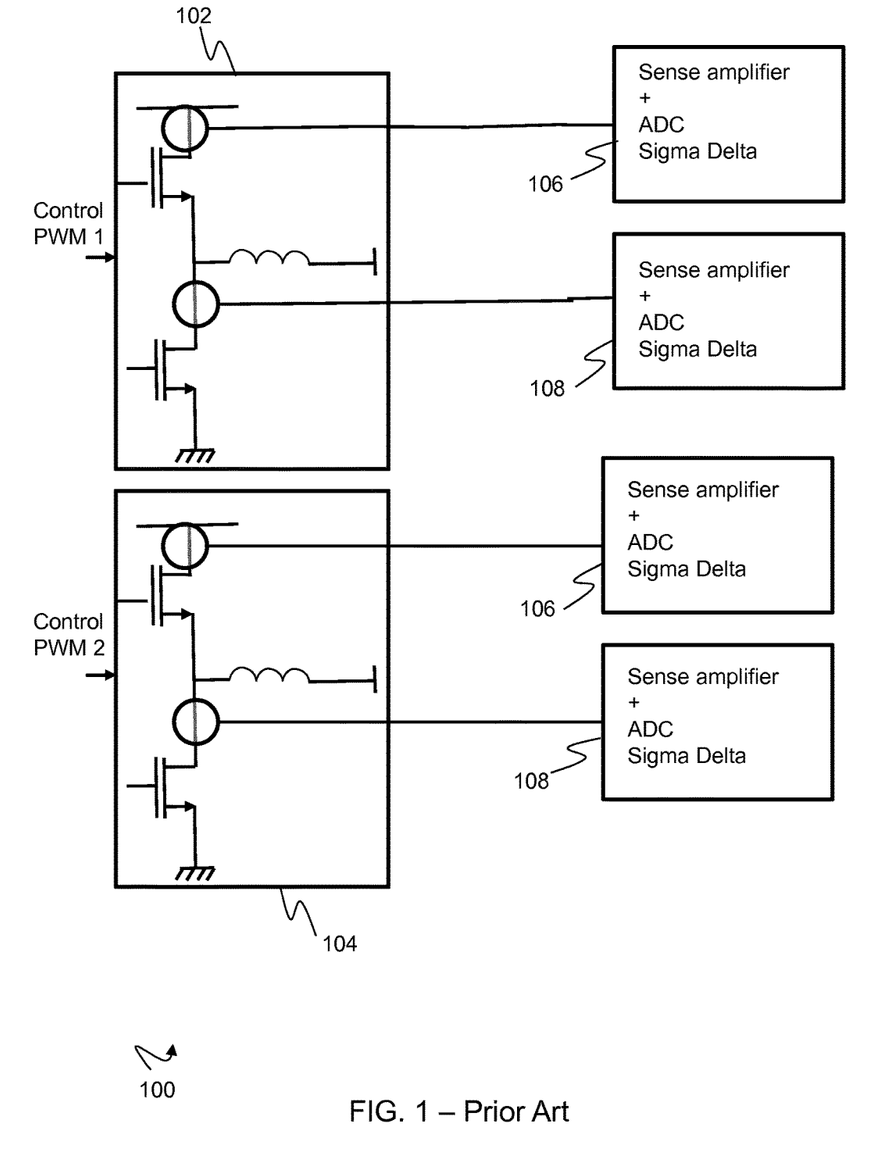
FIG. 1 illustrates a block diagram of part of a known PWM current sensing application.

Referring to FIG. 1, a block diagram of part of a known PWM current sensing application 100 is illustrated comprising, a first valve actuation circuit 102 and a second valve actuation circuit 104. The first valve actuation circuit 102 comprises a high-side current sense amplifier 106 and a low-side current sense amplifier 108, wherein the high-side current sense amplifier 106 and low-side current sense amplifier 108 both comprise an analog-to-digital converter (ADC) and a sigma delta modulator. The second valve actuation circuit 104 also comprises a similar high-side current sense amplifier 106 and a low-side current sense amplifier 108.

Therefore, in the known PWM current sensing application 100, each valve actuation circuit 102, 104 requires two sense amplifiers 106, 108. Thus, a typical ESP application that requires at least eight activation circuits would require at least sixteen current sense amplifiers.

Figure 2:
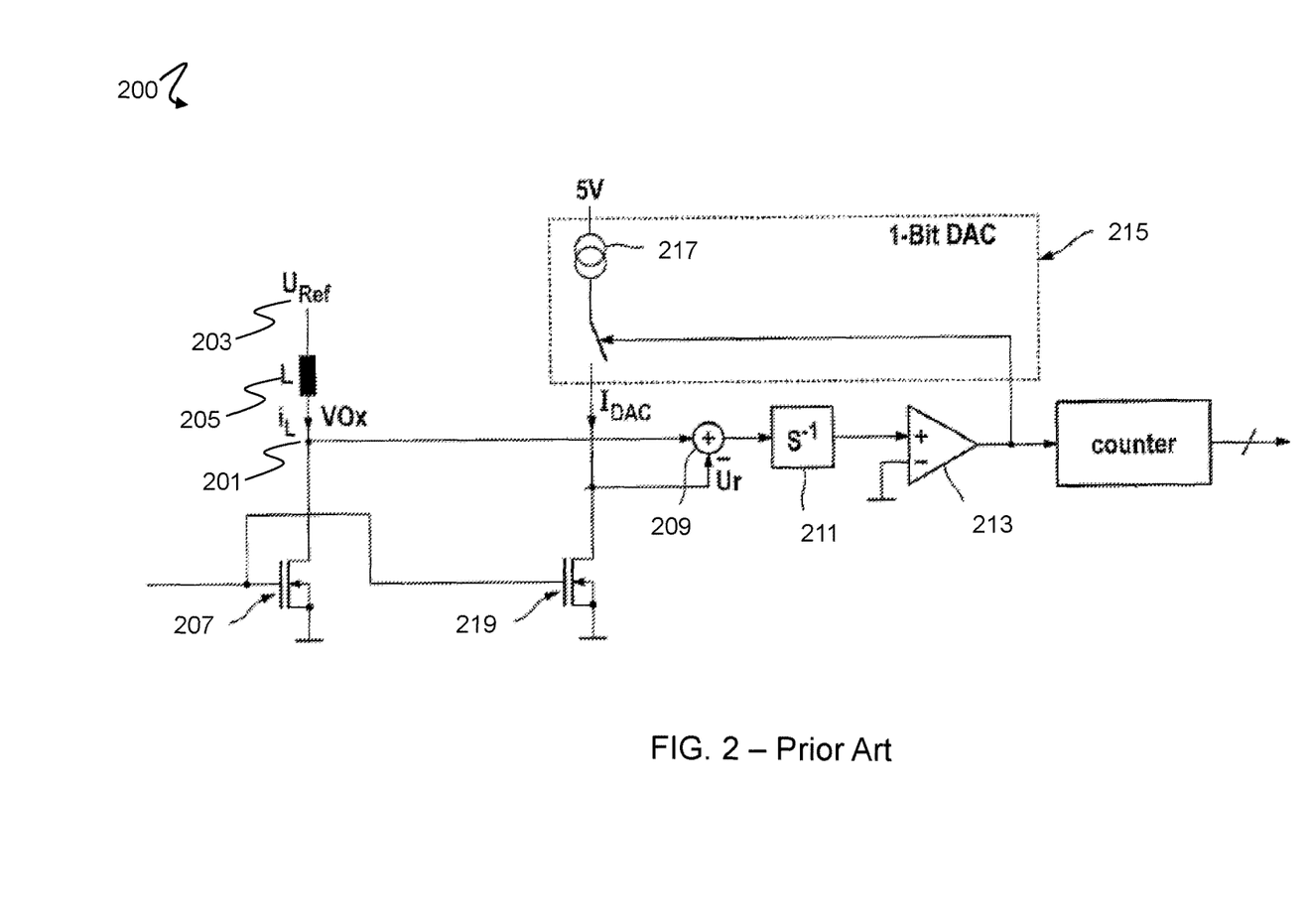
FIG. 2 illustrates a known example of a current measurement circuit.

Referring to FIG. 2, a known example of a current measurement circuit 200, used in the switch-on path of a valve actuation circuit of FIG. 1, is illustrated. The known example of a current measurement circuit 200 comprises, a load current $i_L$ 201, which represents the inductive behaviour of a valve coil, and the channel resistance of a power driver 207 to ground when the power driver 207 in the switch-on path is enabled. The load current $i_L$ 201 is established on the basis of a voltage $U_{ref}$ 203 measured across inductance L 205.

In this known example, a summing junction 209, integrator 211, comparator 213 and 1-bit digital-to-analog (DAC) 215 comprise a sigma delta modulator. The summing point 209 outputs a combined signal to the integrator 211, which is used as a controller and whose output forms the input potential for the comparator 213 relative to ground. The comparator 213 is part of the control path of the control loop and is operated in clocked fashion. The output of the control loop is fed back via the 1-bit DAC 215.

In this way, the 1-bit DAC 215 is in the form of a switchable current source 217, which drives a defined reference current through a sense FET 219 to ground. The gate connections of the power driver 207 and the sense FET 219 are connected to one another, resulting in these two transistors being actuated together when the control loop is in operation and only when the power driver 207 is enabled.

The sigma delta modulation is performed at a frequency that is 256 times as high as the frequency of the PWM, corresponding to a 256 fold oversampling.

Currently, known current sensing systems for PWM drivers use a separate sense amplifier and ADC sigma delta converter for each of the high and low-side of a valve actuation circuit. This is wasteful of current consumption and utilises unnecessary die space.

SUMMARY OF THE INVENTION

The present invention provides a current sensing circuit for a pulse width modulation (PWM) driver and method therefor as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

In some examples, a current sensing circuit may be provided that may be operable to provide current sensing for PWM drivers, which, in some examples, may reside within automotive applications, such as ABS or EPS. Further, in some examples, such a current sensing circuit may be operable to provide comparable or better accuracy of current sensing compared to known current sensors, whilst being able to reduce current consumption and/or die area.

Examples of the invention provide a current sensing circuit for a PWM driver that comprises: a PWM control circuit comprising: a first switching device arranged to receive a PWM signal from the PWM driver whose current is to be sensed; and a second switching device whose supply current is arranged to track the sensed current of the PWM driver. An ADC is operably coupled to the first and second switching device. The ADC comprises: a DAC arranged to provide a current sense to the second switching device that tracks the current passing through the PWM driver; a first comparator arranged to receive and compare an output current from the DAC and an output current from the first switching device; and a first successive approximation register (SAR) arranged to receive an output from the comparator and provide: a first output to the ADC; and a second output that provides a representation of the sensed current. An integrated circuit comprising the current sensing circuit and a method therefor are also described.

Figure 3:
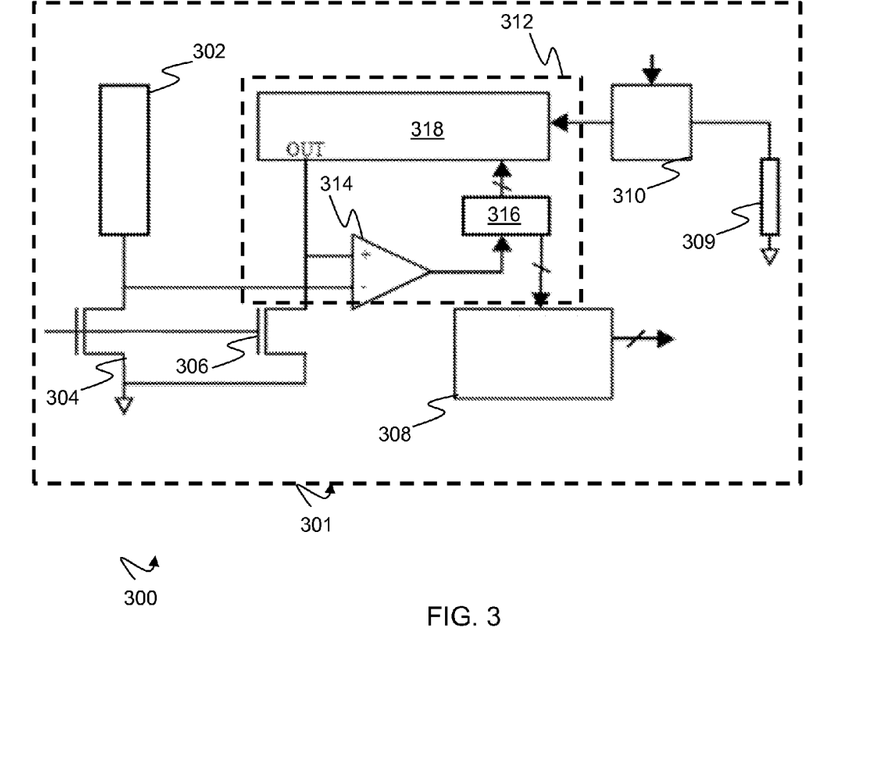
FIG. 3 illustrates an example of a PWM current sense/control circuit.

Referring to FIG. 3, an example of a current sensing circuit 300 is illustrated. In this example, the current sensing circuit 300 comprises an integrated circuit 301 comprising: a load 302, for example a pulse width modulation (PWM) driver, which may represent a valve coil for example, a first switching device 304, which may be a field effect transistor (FET), a second switching device 306, which may be a sensing FET, a filter 308, for example a digital low pass filter, a bias generator 310 and an analog-to-digital converter (ADC) 312.

In this example, the ADC 312 may comprise a comparator 314, a successive approximation register (SAR) 316 and a digital-to-analog converter (DAC) 318, which may be for example an 8-bit current DAC.

In this example, the current sensing circuit 300 may be utilised for current sensing on a low-side of a first valve actuation circuit, for example. Therefore, a similar approach may be utilised for a corresponding high-side current sensing circuit.

The current sensing circuit 300 may be operable to provide an accurate value of the average current through the PWM driver 302, which in this example is illustrated for the low-side of a pulse width modulation driver circuit, for example a first valve actuation circuit. This may be achieved, at least in part, by obtaining an accurate value of the driver current for the second switching device 306, by driving the current through an external resistor 309, wherein the value of the external resistor 309 may be known apriori.

The external resistor 309 may be utilised to generate a bias current reference for the bias generator 310, wherein the bias generator 310 may be operable to generate an accurate internal bias for the current sensing circuit 300. The current generated by the bias generator 310 is applied to the DAC 318, which in this example may be an 8-bit DAC. The DAC 318 may output a drain current, determined partly by the DAC 318, to the second switching device's 306 drain input. Further, the output drain current by the DAC 318 may also be operably coupled to a first terminal, which may be a non-inverting terminal, of the comparator 314.

A second terminal, which may be an inverting terminal of the comparator 314, may be operably coupled to a drain terminal of the first switching device 304, wherein the drain terminal of the first switching device 304 may be operably coupled to the PWM driver 302.

The comparator 314, once it has received one or more current signals, may be operable to monitor and respond to the drain current of the second switching device 306 and subsequently control the SAR 316.

The SAR 316, in this example, requires eight clock cycles per sample. The operation of the SAR 316 may be based, at least in part, on the comparator 314 and an algorithm selected to control some operational aspects of the SAR 316.

One example of an algorithm utilised to control aspects of SAR 316 may be a dichotomy algorithm. Utilising a dichotomy algorithm, the SAR 316 may be operable to initially control/force the signal levels output from the DAC 318 to a middle range of the DAC 318. In this manner, the use of a dichotomy algorithm is simple and predictive and robust. Subsequently, the comparator 314 may indicate whether the PWM driver 302 is inside an upper or lower current range of the DAC 318. According to the indication from the comparator 314, the SAR 316 may force a new middle current range value within the upper or lower current range and thereafter converge to this value within the 8 clock cycles, in this example.

In this example, the comparator 314, SAR 316, and 8-bit DAC 318, which form the ADC 312, may be operable to update and if necessary change the second switching device's 306 bias current every eight clock cycles. In some other examples, depending on the number of bits of the DAC 318, the bias current of the second switching device 306 may be updated for a differing number of clock cycles.

Further, in some examples, increasing the number of bits employed by DAC 318 may increase the overall accuracy of the ADC 312.

In some examples, the SAR 316 may be initialised so that a most significant bit (MSB) may be equal to a coded digital '1', for example. This coded digital '1' may be subsequently operably coupled to the DAC 318, wherein the DAC 318 may be operable to supply an analog equivalent of the coded digital '1' into the comparator 314 and drain of the second switching device 306. The comparator 314 may subsequently be operable to compare the received analog equivalent to the coded digital '1', with a sampled input voltage, for example from the PWM driver 302. If the comparator 314 determines that the analog voltage exceeds the sampled input voltage, the comparator 314 output dictates the value of the signal output from the SAR 316 to the DAC 318, and may, via an output signal, reset this bit. Otherwise, the bit may be left as a coded digital '1'. Subsequently the next bit of the DAC 318 may also be set to a digital '1', and the same procedure as discussed above may be followed. This procedure may be continued until each bit has been tested, which may result in a digital approximation of the sampled input voltage and may finally be output by the SAR 316 at the end of conversion to the filter 308, which in this example may be a digital low pass filter 308.

In some other examples, the filter 308 may be equivalent to a proportional integral derivative (PID) controller or a proportional integral (PI) controller, which may provide a derived filter response for loop regulation current.

In some examples, by utilising an ADC 312 that comprises a DAC 318, SAR 316 and comparator 314, the ADC 312 may utilise less power than other known current sensing devices, for example current sensing devices utilising sigma delta ADC implementations.

In some examples the current sensing circuit 300 may be implemented within a valve actuation circuit, for example first valve actuation circuit 102 from FIG. 1. Therefore, current sensing circuit 300 may be utilised as a low-side current sensing circuit, and a similar or duplicate circuit to current sensing circuit 300 may be utilised as a high-side current sensing circuit.

Figure 4:
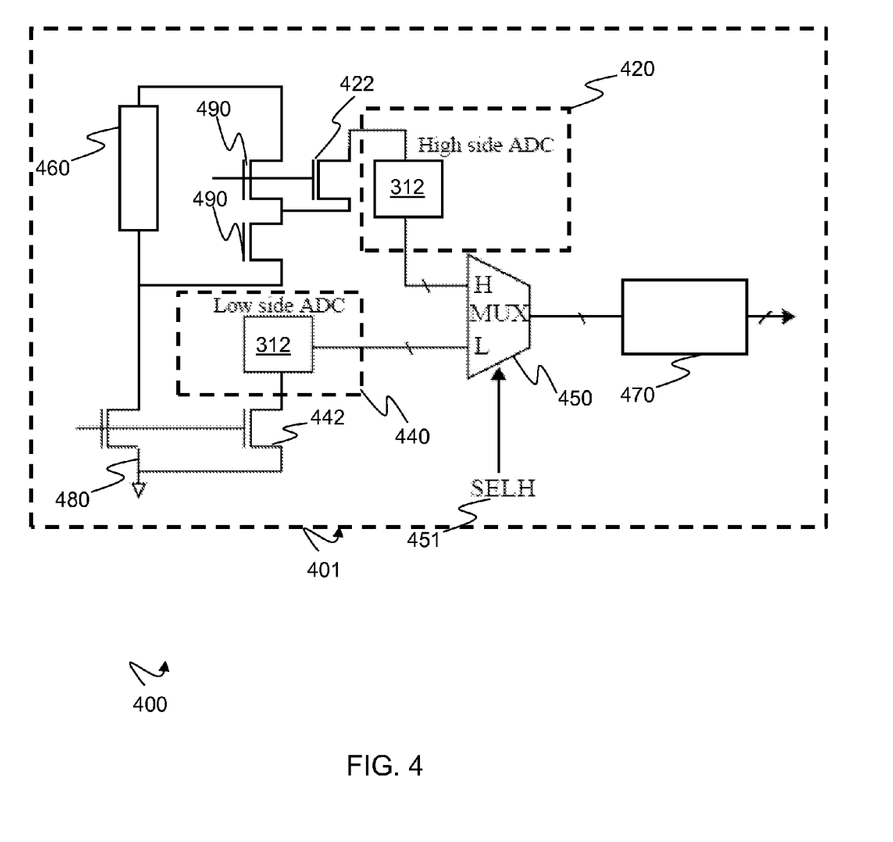
FIG. 4 illustrates a further example of a PWM current sense/control circuit.

Referring to FIG. 4, a simplified block diagram of a further example current sensing circuit 400 is illustrated. In this example, the further example current sensing circuit 400 comprises an integrated circuit 401 comprising: a high-side current sensing circuit 420, a low-side current sensing circuit 440, multiplexer 450, PWM driver 460, filter 470, low-side power switching device 480 and high-side power switching devices 490. In this example, the current sensing circuit 400 may be situated on, or located within an activation circuit, such as illustrated in the activation circuit of FIG. 1.

In this example, the low-side current sensing circuit 440 may comprise a low-side sensing switching device 442, for example a current sensing FET, and the ADC 312 from FIG. 3. In this example, the ADC 312 may comprise the comparator 314, SAR 316 and DAC 318. Further, in this example, the high-side current sensing circuit 420 may comprise a high-side sensing switching device 422 and a further ADC 312, wherein the ADC 312 may be a duplicate of the low-side current sensing circuit, comprising a low-side current DAC 318.

In an example operation, the low-side power switching device 480 may be enabled, and the high-side power switching devices 490 may be disabled. In this example, the low-side power switching device 480 may allow current to flow into the PWM driver 460, which in this example may be an inductive load, coil, valve coils, etc., from a source, which may be a battery, to ground. In this example, the current within the PWM driver 460 may increase whilst the low-side power switching device 480 is enabled.

Subsequently, if the low-side power switching device 480 is disabled, current may be recirculated via the now enabled high-side power switching pair of devices 490. In this case, the current may flow through the PWM driver 460 and the high-side power switching pair of devices 490, thereby causing the current to decrease in the PWM driver 460.

During the above described operation, the high-side sensing switching device 422 and the low-side sensing switching device 442 may measure the currents during the different states of the activation circuit, and utilising the high-side ADC 420 and low-side ADC 440, verify with a regulation loop whether the 'sensed' current is in line with a programmed current. If it is determined that the sensed current is not in line with the programmed current, a PWM's duty cycle period may be adjusted to regulate the sensed current to match the programmed current. By adjusting the duty cycle (for example a turn 'on' time vs turn 'off' time on a single period for the low-side), it is possible to force more or less current, an increase in the duty cycle creates an increase in the low-side current and vice versa.

In this example, two high-side power switching devices 490 are illustrated, as this example may facilitate slow or fast recirculation. In operation, during the recirculation, the current is decreasing via the two high-side power switching devices 490. If the two high-side power switching devices 490 are maintained as being 'on', the decrease in current will be slow (for example as the voltage applied is low across the load:

voltage=2Rdson (of the two high-side power switching devices 490)×the initial current.

Hence, the ripple current will be low (i.e. the normal mode for the current regulation). After regulation, in order to discharge the inductive load very fast (i.e. the system is required to be fully 'off'), it is important to present a voltage across the load that is much higher than 2 Rdson (of the two high-side power switching devices 490). Therefore, one of the two high-side power switching devices 490 are controlled in an equivalent clamp in order to present a voltage >20V instead of a maximum of, say, 1-2V in slow recirculation.

However, in an alternative example, a similar operation to that discussed above may be achieved utilising only a single high-side power switching device.

The multiplexer 450 in this example may be operable to redirect data from either the low-side ADC 440 or high-side ADC 420, dependent upon which ADC 440, 420 is enabled. For example, if the low-side power switching device 480 is enabled, the multiplexer 450 may be controlled via an external signal 451 (with SELH='0') to redirect data from the low-side ADC 440 to the filter 470, which in this example may be a digital low pass filter. Otherwise, if the high-side power switching devices 490 are enabled, the multiplexer 450 may be controlled, via external signal 451 (with SELH='1'), to redirect data from the high-side ADC 420 to the filter 470.

In some examples, the filter 470 may be equivalent to a proportional integral derivative (PID) controller or a proportional integral (PI) controller, which may provide a derived filter response for loop regulation current.

In this example, the multiplexer 450 may also be operable to sum the current from the low-side ADC 440 and the high-side ADC 420. In this manner, the multiplexer 450 is allowed to select either the high-side data or low-side data. For example, the multiplexer 450 alternately selects between the low-side being 'on' (with the high-side being 'off') and then the high-side being 'on' (with the low-side being 'off'), in one period of regulation current. Thus, in one period, the multiplexer 450 is configured to transfer the sum of two different (high-side and low-side) data to the filter 470, in order to re-build the shape of the load current.

Figure 5:
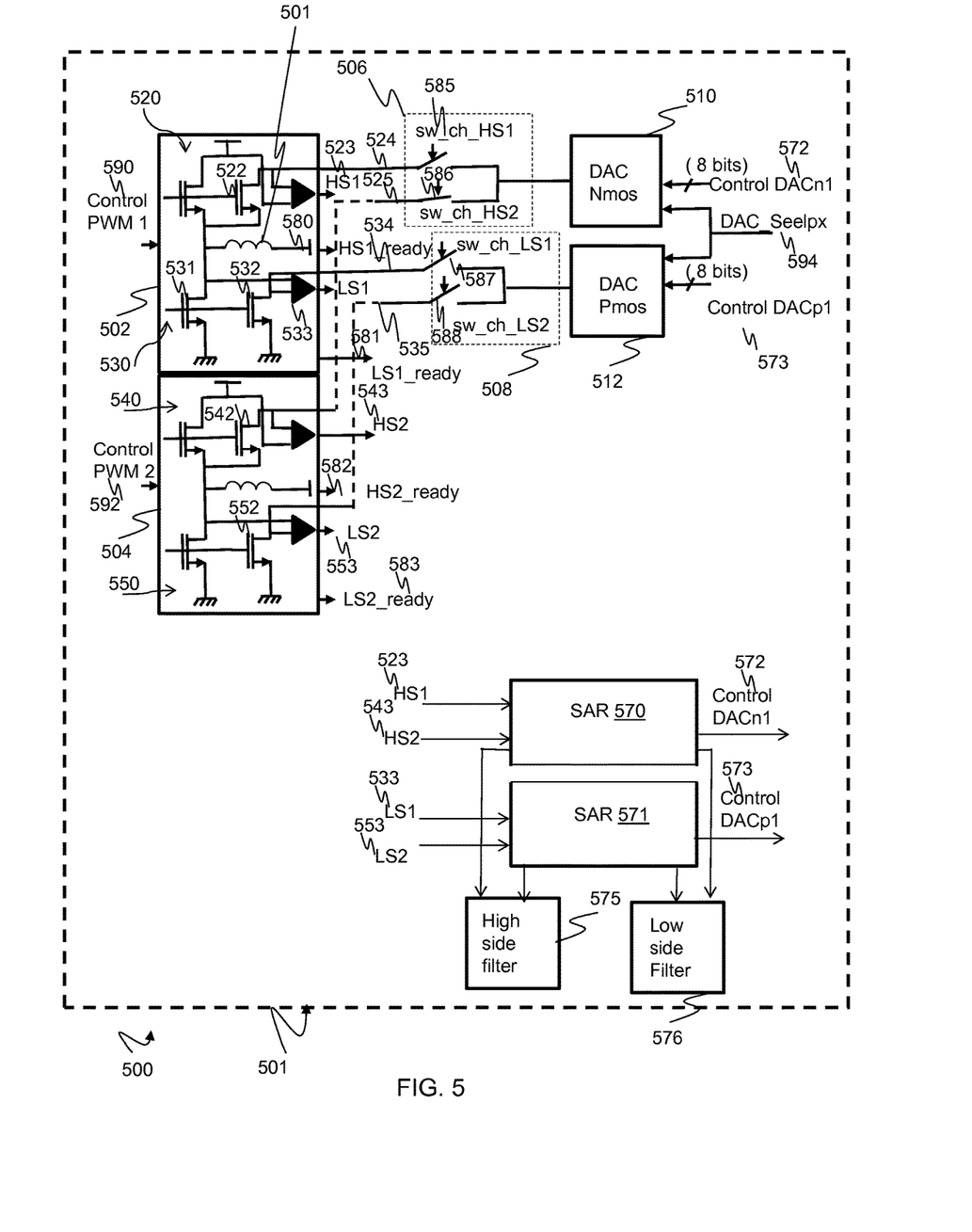
FIG. 5 illustrates a further example employing multiple PWM control circuits.

Referring to FIG. 5, a further example of a current sensing circuit 500 is illustrated. The further example of a current sensing circuit 500 comprises an integrated circuit 501 comprising: a first PWM control circuit 502, which may be a valve actuation circuit, a second PWM control circuit 504, which may also be a valve actuation circuit, a high-side multiplexer 506, a low-side multiplexer 508, a high-side DAC 510 and a low-side DAC 512.

In this example, the first PWM control circuit 502 may comprise a high-side portion 520 and a low-side portion 530, wherein a drain contact of a high-side sense FET 522 may be operably coupled to a first channel 524 of the high-side multiplexer 506, and a drain contact of a low-side sense FET 532 may be operably coupled to a first contact 534 of the low-side multiplexer 508.

Similarly, the second PWM control circuit 504 may comprise a second high-side portion 540 and a second low-side portion 550, wherein a drain contact of a second high-side sense FET 542 may be operably coupled to second contact 525 of the high-side multiplexer 506, and a drain contact of a second low-side sense FET 552 may be operably coupled to a second contact 535 of the low-side multiplexer 508. Either the high-side portion 520, 540 or the low-side portion 530, 550 of circuits 502, 504 may be enabled at any one instance. Therefore, it may not be possible for both the high-side portions 520, 540 and low-side portions 530, 550 of PWM control circuit 502 or 504 to be enabled at the same time.

As a result, the inventors of this application have realised that it may be beneficial to multiplex, via high-side multiplexer 506, the high-side 520 of the first PWM control circuit 502 and the high-side 540 of the second PWM control circuit 504. Further, it may be beneficial to multiplex, via low-side multiplexer 508, the low-side 530 of the first PWM control circuit 502 and the low-side 550 of the second PWM control circuit 504.

Therefore, in this example, only two DACs 510 and 512 may be required for the two PWM control circuits 502, 504, even though the two PWM control circuits 502, 504 comprise two high-side portions 520, 540 and two low-side portions 503, 550. In some examples, this may have an advantage of reducing the number of DACs required and, therefore, reduce the area taken up by the current sensing circuit 500 on a die, for example. Furthermore, utilising fewer DACs may reduce power consumption within the current sensing circuit 500.

In an example operation, the high-side multiplexer 506 may be operable to selectively couple an Nmos drain current, via DAC 510, to either the first high-side sense FET 522 or the second high-side sense FET 542, wherein the first high-side sense FET 522 may be located on a separate channel to the second high-side sense FET 542. Furthermore, the low-side multiplexer 508 may be operable to selectively couple a Pmos drain current, via DAC 512, to either the first low-side sense FET 532 or the second low-side sense FET 552, wherein the first low-side sense FET 532 may be located on a separate channel to the second low-side sense FET 552.

In this example, only one high-side output from the high-side multiplexer 506 may be selectively enabled at any one time, as otherwise the DAC 510 may receive two control inputs from two different circuits, and thus be unable to control the current level for the circuits.

Further, in this example, only one high-side or low-side output can be selectively enabled for each PWM control circuits 502, 504, as it may not be possible to selectively enable both high-side and low-side of a particular PWM control circuit 502, 504.

In some other examples, only one low-side output from the low-side multiplexer 512 may be selectively enabled at any one time, as otherwise the DAC 512 may receive two control inputs from two different PWM control circuits, and thus be unable to control the current level for the PWM control circuits.

In this example, depending on which output from the high-side multiplexer 506 has been selectively enabled, either an output signal from first high-side comparator (HS1) 523 or second high-side comparator (HS2) 543 may be operably coupled to a SAR 570. The selectively enabled signal from one of the high-side comparators 523, 543 may compare the current from the selected high-side portions 520, 540 with DAC 510 driving a Nmos FET. Subsequently, the SAR 570 may output a control signal, in this example, to DACn1 572, which may be operable to control the DAC 510 in order to determine the correct current in the selected high-side. In some examples, depending on the channel selected by the high-side multiplexer 506, the SAR 570 may either output a DACHS1 control signal or a DACHS2 control signal.

Further, the SAR 570 may output a signal to a high-side filter 575 or a low-side filter 576, say via a multiplexer such as multiplexer 450 from FIG. 4 (not shown), wherein in some examples, the high-side filter 575 or low-side filter 576 may be equivalent to a proportional integral derivative (PID) controller or a proportional integral (PI) controller, which may provide a derived filter response for loop regulation current.

A similar operation as described above for a high-side operation may also be utilised for a low-side operation. Therefore, depending on which output from the low-side multiplexer 508 has been selectively enabled, either an output signal from the first low-side comparator (LS1) 533 or a second low-side comparator (LS2) 553 may be operably coupled to a further SAR 571. Here the selectively enabled signal from one of the low-side comparators 533, 553 may compare the current from the selected low-side portions 530, 550 with DAC 512 driving a Pmos FET. Subsequently, the SAR 571 may output a control signal, in this example, DACp1 573, which may be operable to control the DAC 512 in order to determine the correct current in the selected low-side. In some examples, depending on the channel selected by the low-side multiplexer 508, the SAR 571 may either output a DACLS1 control signal or a DACLS2 control signal.

Further, the SAR 571 may output a signal to a low-side filter 576 or a high-side filter 575, say via a multiplexer such as multiplexer 450 from FIG. 4 (not shown), wherein in some examples, the low-side filter 576 or high-side filter 575 may be equivalent to a proportional integral derivative (PID) controller or a proportional integral (PI) controller, which may provide a derived filter response for loop regulation current.

In some examples, an indication signal 580, 581, 582, 583 may be output by PWM control circuits 502, 504 to logic (not shown), to inform the logic that a particular high-side or low-side of PWM control circuits 502, 504 may be ready for measurement(s).

Further, in some examples, the logic may interrogate the various indication signals 580, 581, 582, 583, and output control signals 585, 586, 587, 588 that may be operable to selectively control the switches of multiplexers 506, 508.

Subsequently, in some examples, the logic may be operable to output control PWM signals 590, 592, which may be operable to control a channel function of the current measured in order to regulate the measured current with a desired current level.

In some examples, the logic may further output a disabling signal 594, which may be operable to selectively cut the consumption of each DAC 510, 512.

In this example, the possibility of multiplexing the DACs 510, 512 may allow for a two-fold reduction in die area and current consumption, which is not currently available for legacy systems utilising sigma delta circuits, which also cannot be multiplexed in this way in real time.

It should be noted that the example(s) illustrated in FIG. 5 relate to a two circuit system. This is simply for clarifactory purposes, and any number of circuits could be multiplexed.

For example, for a four circuit system, each high-side and low-side multiplexer may be implemented with four outputs, which may be operable to selectively enable one of a number of high-side and low-side circuit portions. However, in order for a four circuit system to be implemented, the frequency of the system may need to be doubled with respect to the two circuit system illustrated in FIG. 5. An advantage of implementing examples of the invention with a four circuit system may be that the die area and power consumption may decrease by a further factor of two, when compared to a two circuit system utilising some examples of the invention. Therefore, in this example, a DAC or multiple DACs driving multiple Nmos and Pmos FETs may be able to support four circuits, comprising a total of eight high-side and low-side portions.

In another example, if the frequency of operation is again doubled with respect to the four circuit system, and the high-side and low-side multiplexer's outputs increased to eight, an Nmos and Pmos DAC may be able to support eight circuits, thereby reducing the die area and power consumption by a further factor of four compared to the four circuit example that uses the known sigma delta implementation.

Figure 6:
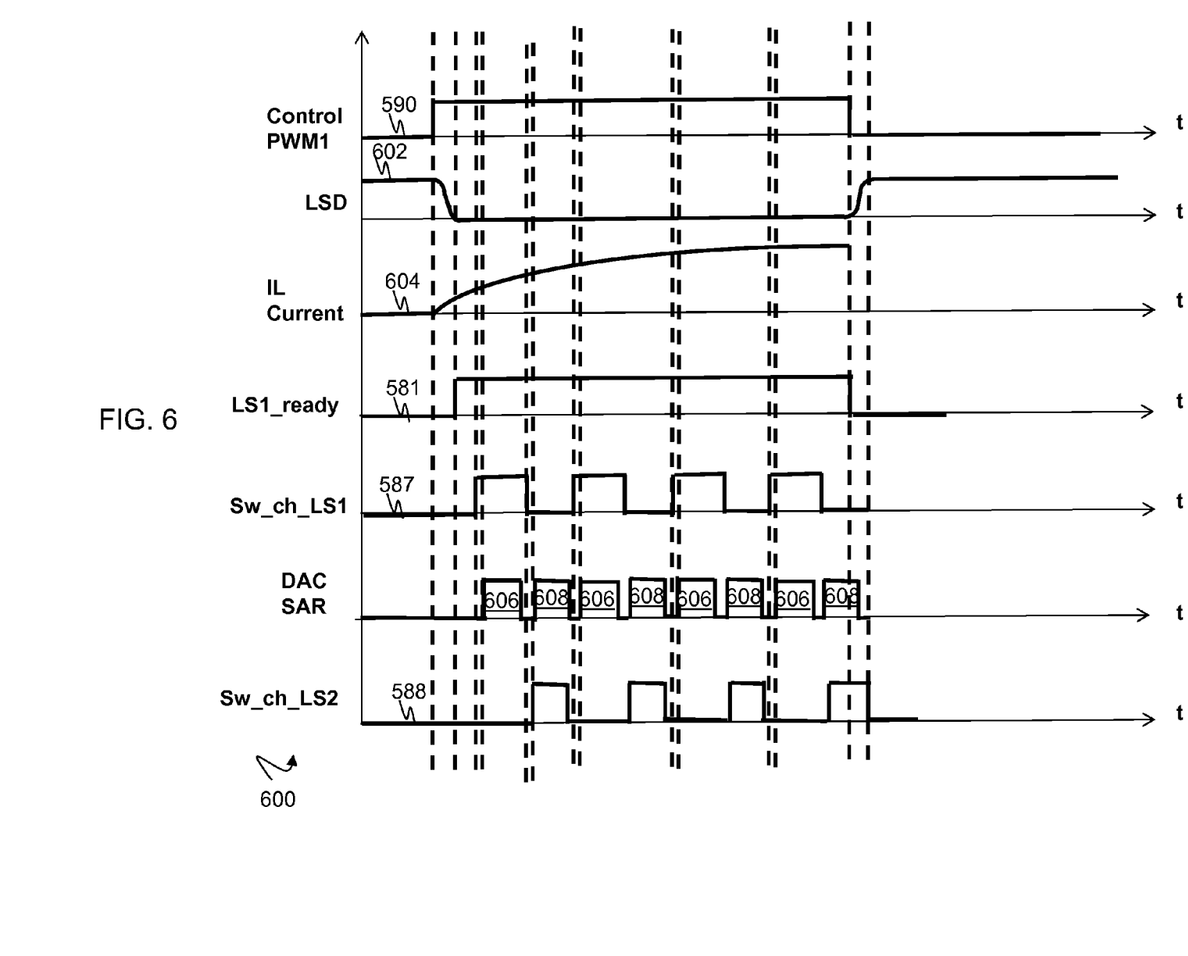
FIG. 6 illustrates an example set of waveforms that may be utilised with some examples of the invention.

Referring to FIG. 6, an example of a series of waveforms 600, which may be suitable to be implemented some examples of the invention are illustrated. In this example, a two channel low-side operation has been illustrated for simplicity. Obviously, for more channels to be implemented, the operating frequency may have to be increased to enable more switching operations for a given time, and further channels would need to be implemented within various circuit elements, for example low-side and high-side multiplexers.

In this illustrated waveform example, the series of waveforms may be applied to the first PWM control circuit 502 from FIG. 5, particularly the low-side portion 530. Initially, a PWM control signal 590 may be enabled, and operably coupled to, for example, a gate of a low-side driver 531, for example a power FET. In this example, the low-side driver 531 may be a PMOS device and, therefore, may require a gate voltage 602 that has a threshold lower than the other terminals of the device. Therefore, in this example, once the PWM signal 590 is enabled, the gate voltage 602 to the low-side driver may reduce in order to switch on the low-side driver 531, thereby enabling current to flow into a load/PWM driver, for example a valve coil, causing the current 604 in the PWM driver to increase.

Subsequently, logic within the first PWM control circuit 502 may output a control signal 581 indicating that the low-side portion 530 may be ready for a measurement.

As a result, logic may output a first control signal 587 to a first switch of a low-side multiplexer 508, in order to selectively enable sense FET 532 and comparator 533. A second control signal 588 may be output by logic to selectively control a second low-side portion 550 of second PWM control circuit 504, so that both low-sides 530, 550 are not enabled at the same time.

Resultant signals from the comparators 533 and 553, based on the respective selectively coupled control signals 587, 588, may be operably coupled to SAR 570.

In this example, either a DACLS1 signal 606 or a DACLS2 signal 608 may be output by the SAR 570, which may be dependent on which of the low-side portions 530, 550 were selectively enabled by the low-side multiplexer 508 and control signals 587, 588.

A similar operation to that described above may be utilised for a high-side portion, for example high-side portion 520 from the first PWM control circuit 502 and high-side portion 540 from the second PWM control circuit 504.

In some examples, by utilising an ADC, for example ADC 312, comprising at least a comparator 314, SAR 316 and DAC 318, for high-side portions 520, 540 and low-side portions 530, 550 for a plurality of circuits 502, 504, and multiplexing the high-side portions 520, 540 and low-side portions 530, 550, wherein the high-side portions 520, 540 and low-side portions 530, 550 may be on separate channels, a power and die area saving may be achieved. This may be due, at least in part, to only requiring two DACs, one for high-side drivers and one for low-side drivers for all circuits. This is in contrast to known circuits that require a separate DAC for each high-side driver and each low-side driver for each circuit.

Figure 7:
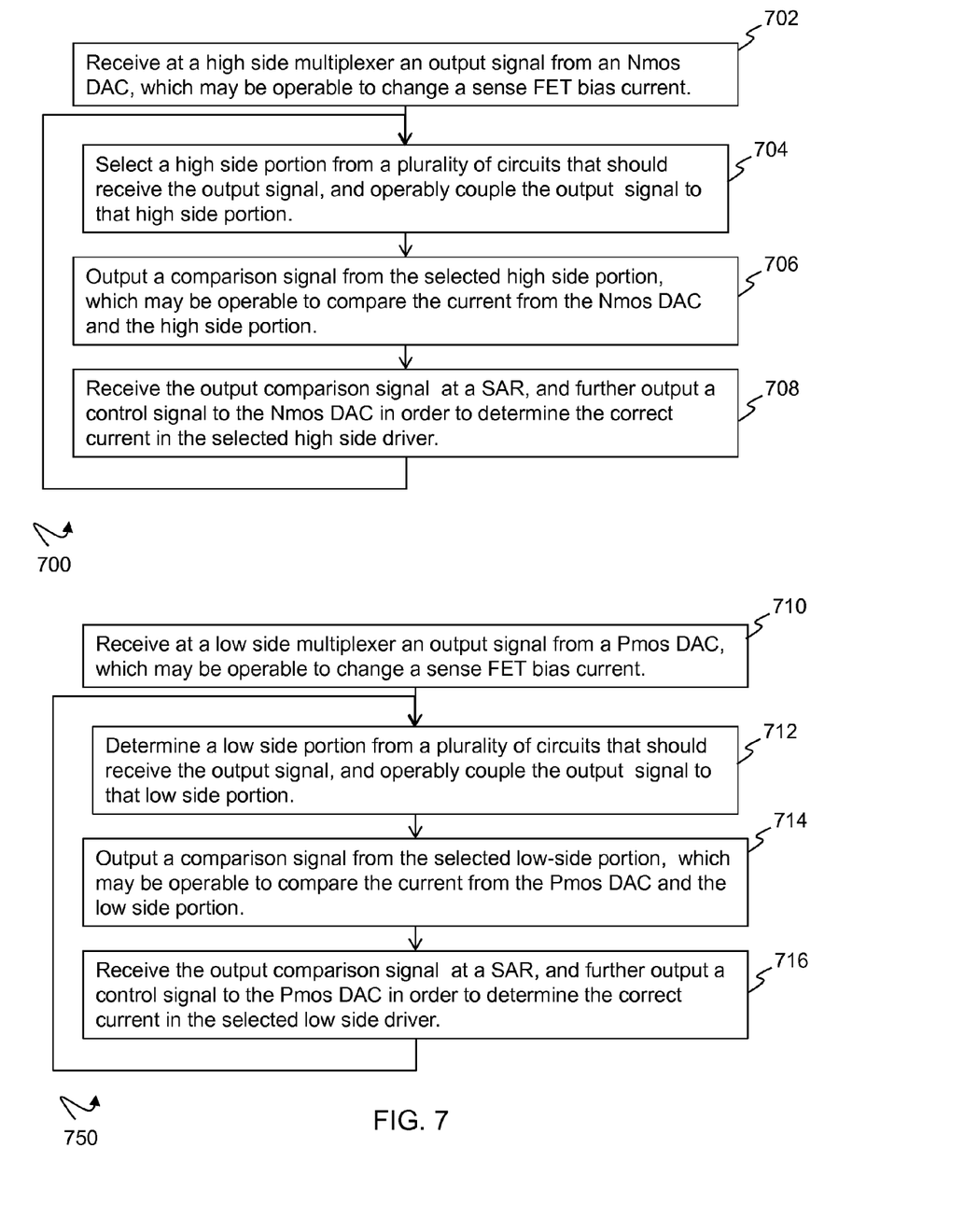
FIG. 7 illustrates an example flow chart of a high-side operation and an example flow chart of a low-side operation of a current control circuit.

Referring to FIG. 7, an example flow chart of a high-side operation 700 of a current sensing circuit and an example flow chart of a low-side operation 750 or a current sensing circuit are illustrated.

Referring first to the high-side operation 700, at 702 a high-side multiplexer, for example high-side multiplexer 506 of FIG. 5, may receive an output signal from a DAC, for example high-side DAC 510 driving a Nmos FET. A selective determination 704 of a high-side portion is made, for example high-side portion 520, and the selected high-side portion is coupled to transmit the output signal from the DAC 510.

Subsequently, the selected high-side portion 520 may, utilising comparator 523, for example, output a comparison signal 706, which may be based on a comparison between the current signal from the DAC 510 driving a Nmos FET and the high-side portion 520. This output comparison signal may be received 708 by SAR 570, which may further output a control signal to the DAC 510 driving a Nmos FET in order to determine the correct current in the selected high-side portion, in this example high-side portion 520.

In this example, the multiplexer 506 may be operable to selectively output a high-side DAC 510 signal to one of a plurality of high-side portions, wherein each high-side portion may be situated within a separate circuit, for example a valve actuation circuit, wherein only one of the high-side portions may be selectively enabled at any one time. Therefore, in this example, a plurality of high-side drivers may be selectively and individually controlled via a single DAC, for example high-side DAC 510 driving a Nmos FET, utilising, for example, a multiplexer with a suitable number of selectively controllable outputs.

Referring to the low-side operation 750, initially, at 710, a low-side multiplexer, for example low-side multiplexer 508 may receive an output signal from a DAC, for example low-side DAC 512. A selective determination 712 of a low-side portion is made, for example low-side portion 530, and the selected low-side portion is coupled to transmit the output signal from the DAC 512.

Subsequently, the selected low-side portion 530 may, utilising comparator 533, for example, output a comparison signal 714, which may be based on a comparison between the current signal from the low-side DAC 512 driving a Pmos FET and the low-side portion 530. This output comparison signal may be received 716 by SAR 570, which may further output a further output control signal to the low-side DAC 512 driving a Pmos FET in order to determine the correct current in the selected low-side portion, in this example low-side portion 530.

In this example, the multiplexer 508 may be operable to selectively output a low-side DAC 512 signal to one of a plurality of low-side portions, wherein each low-side portion may be situated within a separate circuit, for example a valve actuation circuit, wherein only one of the low-side portions may be selectively enabled at any one time. Therefore, in this example, a plurality of low-side drivers may be selectively and individually controlled via a single DAC, for example low-side DAC 512 driving a Pmos FET, utilising, for example, a multiplexer with a suitable number of selectively controllable outputs.

In some examples, it may be necessary to utilise separate DACs for high-side and low-side operations. This may be because a system may measure the consistency between low-side measurements and high-side measurements, in order to determine whether the results reported by the system are correct. However, if only one DAC is utilised for both high-side and low-side operations, and there is a latent directivity on the DAC versus the lifetime of an application, it may not be possible to determine if the current regulation is correct, because the DAC may be defective.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device.

Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements.

The mere fact that certain measures are recited in mutually different claims does not indicate that a combination of these measures cannot be used to advantage.

The invention claimed is:

1. A current sensing circuit for a pulse width modulation driver, the current sensing circuit comprising:
  a first PWM control circuit comprising:
    a first switching device arranged to receive a PWM signal from the PWM driver whose current is to be sensed; and
    a second switching device whose supply current is arranged to track the sensed current of the PWM driver;
  a first analog-to-digital converter operably coupled to the first switching device and second switching device, wherein the first ADC comprises:
    a first digital-to-analog converter arranged to provide a current sense to the second switching device that tracks the current passing through the PWM driver;
    a first comparator arranged to receive and compare an output current from the first DAC and an output current from the first switching device; and
    a first successive approximation register arranged to receive an output from the comparator and provide:
      a first output to the first ADC; and
      a second output that provides a representation of the sensed current.

2. The current sensing circuit of claim 1 wherein the first ADC is arranged to provide a high-side current sense of a current from the PWM driver, wherein the current sensing circuit further comprises:
  at least one further first switching device arranged to receive the PWM signal from the PWM driver whose current is to be sensed; and
  at least one further second switching device whose supply current is arranged to track the sensed current of the PWM driver; and
  a second ADC operably coupled to the at least one further first switching device and the at least one further second switching device, wherein the second ADC comprises:
    a second DAC arranged to provide a current sense to the at least one further second switching device that tracks low-side current passing through the PWM driver;
    a second comparator arranged to receive and compare an output current from the second DAC and an output current from the at least one further first switching device; and
    a second SAR arranged to receive an output from the comparator and provide:
      a first output to the second ADC; and
      a second output that provides a representation of the sensed current.

3. The current sensing circuit of claim 2 further comprising a multiplexer arranged to receive at least one output from at least the first ADC and the second ADC and selectively route a selected output to a filter.

4. The current sensing circuit of claim 2 wherein the first ADC is a high-side ADC and the second ADC is a low-side ADC, such that only the first ADC or second ADC is enabled at a particular time.

5. The current sensing circuit of claim 3 wherein the multiplexer comprises a switch network and the second switching device and the at least one further second switching device are sense FETs, such that a high-side portion of the multiplexer comprises a first switch coupled to a drain of the second switching device, and a low-side portion of the multiplexer comprises a second switch coupled to a drain of the at least one further second switching device.

6. The current sensing circuit of claim 5 wherein the switch network selectively couples the first DAC to either an NMOS current of the first switching device or the second DAC to a PMOS current of the at least one further first switching device.

7. The current sensing circuit of claim 5 wherein the first DAC is coupled to the first switching device on a first channel and the second DAC is coupled to the at least one further first switching device on a second channel, wherein the first and second channels are isolated.

8. The current sensing circuit of claim 7 wherein a switching frequency of the switching network is proportional to the number of isolated, individual channels.

9. The current sensing circuit of claim 2 wherein the first PWM control circuit forms at least a part of a valve actuation circuit.

10. The current sensing circuit of claim 1 further comprising at least one second PWM control circuit arranged in parallel to the first PWM control circuit.

11. The current sensing circuit of claim 1 wherein the first DAC is an N-bit DAC.

12. The current sensing circuit of claim 1 wherein the first DAC is an N-bit DAC such that the current sense output from the first ADC is updated every N clock cycles.

13. An integrated circuit comprising the current sensing circuit of claim 1.

14. The integrated circuit of claim 13 when implemented in at least one of: an anti-lock braking systems, electronic stabilisation programs.

15. A method for current sensing of a pulse width modulation driver, the method comprising:
  receiving a PWM signal at a first switching device from a PWM driver whose current is to be sensed;
  tracking the sensed current of the PWM driver at a supply current of a second switching device;
  receiving and comparing an output current from a first DAC and an output current from the first switching device;
  applying the comparison to a first successive approximation register;
  digital-to-analog converting a first output from the first SAR to provide a current sense to the second switching device that tracks the current passing through the PWM driver; and
  providing a representation of the sensed current by the first SAR via a second output.

16. The method of claim 15 further comprising:
  receiving the PWM signal at an at least one further first switching device;
  tracking the sensed current of the PWM driver at a supply current of at least one further second switching device;
  receiving and comparing an output current from a second DAC and an output current from the at least one further first switching device;
  applying the comparison to a second successive approximation register;
  digital-to-analog converting a first output from the second SAR to provide a current sense to the at least one further second switching device that tracks the current passing through the PWM driver; and
  providing a representation of the sensed current by the second SAR via a second output.

17. The method of claim 16 further comprising:
receiving at least one output from at least the first ADC and the second ADC; and
selectively routing a selected output to a filter.

18. The method of claim 16 further comprising:
selectively enabling either the first ADC as a high-side ADC or the second ADC as a low-side ADC, such that only the first ADC or second ADC is enabled.

19. The method of claim 16 when implemented in at least one of: an anti-lock braking systems, electronic stabilisation programs.

* * * * *